US011609597B2

(12) United States Patent
Cai et al.

(10) Patent No.: US 11,609,597 B2
(45) Date of Patent: Mar. 21, 2023

(54) WIRELINE TRANSCEIVER WITH INTERNAL AND EXTERNAL CLOCK GENERATION

(71) Applicant: Marvell Asia Pte Ltd, Singapore (SG)

(72) Inventors: Li Cai, Singapore (SG); Sau Siong Chong, Singapore (SG); Chang-Feng Loi, Singapore (SG); Lawrence Tse, Fremont, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/643,995

(22) Filed: Dec. 13, 2021

(65) Prior Publication Data

US 2023/0055107 A1 Feb. 23, 2023

Related U.S. Application Data

(60) Provisional application No. 63/242,009, filed on Sep. 8, 2021, provisional application No. 63/235,124, filed on Aug. 19, 2021.

(51) Int. Cl.
*G06F 1/08* (2006.01)
(52) U.S. Cl.
CPC ..................................... *G06F 1/08* (2013.01)

(58) Field of Classification Search
None
See application file for complete search history.

(56) References Cited

U.S. PATENT DOCUMENTS

| 7,536,570 B2 * | 5/2009 | Leung .................. G06F 1/3203 713/323 |
|---|---|---|
| 2008/0074205 A1 | 3/2008 | Chen et al. |
| 2012/0126907 A1 | 5/2012 | Nakamoto et al. |
| 2019/0006990 A1 | 1/2019 | Marques et al. |
| 2020/0227101 A1 * | 7/2020 | Yoshida .................... H03L 7/14 |

* cited by examiner

*Primary Examiner* — Cassandra F Cox

(57) ABSTRACT

An integrated circuit device, having functional circuitry driven by a clock signal, includes a first clock path for accepting an external clock signal where the first clock path includes first biasing circuitry configured to controllably pass the external clock signal, a second clock path for accepting an external frequency reference signal where the second clock path includes internal clock generation circuitry configured to generate an internal clock signal from the external frequency reference signal and second biasing circuitry configured to controllably pass the external frequency reference signal to the internal clock generation circuitry, and selector circuitry configured to select, based on user input, a clock output to drive the functional circuitry of the integrated circuit device. The clock output is selected from between (i) an output of the first clock path, and (ii) an output of the second clock path.

22 Claims, 7 Drawing Sheets

WIRELINE TRANSCEIVER WITH INTERNAL AND EXTERNAL CLOCK GENERATION

CROSS REFERENCE TO RELATED APPLICATIONS

This disclosure claims the benefit of commonly-assigned U.S. Provisional Patent Applications Nos. 63/235,124 and 63/242,009, filed Aug. 19, 2021 and Sep. 8, 2021, respectively, each of which is hereby incorporated by reference herein in its respective entirety.

FIELD OF USE

This disclosure relates to clock circuitry for integrated circuit devices. More particularly, this disclosure relates to wireline transceivers—esp., high-speed, high-performance wireline transceivers—that support both internal and external clock signal generation.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

Accurate and stable clocks are important for communication channels, such as high-speed wireline communications channels including, for example, Ethernet channels. In some integrated circuit transceivers, external clock sources are used. However, external clock sources, particularly those of reliable quality, may be expensive, and increase overall device size and power consumption when combined with the transceiver circuit itself.

SUMMARY

According to implementations of the subject matter of this disclosure, an integrated circuit device, having functional circuitry driven by a clock signal, includes a first clock path for accepting an external clock signal where the first clock path includes first biasing circuitry configured to controllably pass the external clock signal, a second clock path for accepting an external frequency reference signal where the second clock path includes internal clock generation circuitry configured to generate an internal clock signal from the external frequency reference signal and second biasing circuitry configured to controllably pass the external frequency reference signal to the internal clock generation circuitry, and selector circuitry configured to select, based on user input, a clock output to drive the functional circuitry of the integrated circuit device. The clock output is selected from between (i) an output of the first clock path, and (ii) an output of the second clock path.

In a first implementation of such an integrated circuit device, the second clock path may be configured to accept a passive resonator signal as the external frequency reference signal.

In a second implementation of such an integrated circuit device, the first clock path and the second clock path may share at least one input terminal of the integrated circuit device.

According to an aspect of that second implementation, each of the first clock path and the second clock path may be a respective differential signal path, and the first clock path and the second clock path may share two input terminals of the integrated circuit device.

In a third implementation of such an integrated circuit device, the first biasing circuitry may include at least one termination resistor and a first bias current generator configured to draw current through the at least one termination resistor.

According to a first aspect of that third implementation, the second biasing circuitry may include a second bias current generator that mirrors the first bias current generator.

In an instance of that first aspect of the third implementation, the first biasing circuitry may include at least one first enable switch configured to enable the first bias current generator, the second biasing circuitry may include at least one second enable switch configured to enable the second bias current generator, and the at least one first enable switch and the at least one second enable switch may be configured to disable the second bias current generator when the first bias current generator is enabled, and to disable the first bias current generator when the second bias current generator is enabled.

According to a second aspect of that third implementation, the first clock path may be a differential signal path, the at least one termination resistor may include a respective termination resistor for each respective leg of the differential signal path, and the first bias current generator may be configured to draw current through the respective termination resistor of each respective leg of the differential signal path in a common mode arrangement.

In an instance of that second aspect of the third implementation, the second biasing circuitry may include a second bias current generator that mirrors the first bias current generator, the first biasing circuitry may include at least one first enable switch configured to enable the first bias current generator and a respective additional first enable switch configured to switchably couple each respective first termination resistor to the first bias current generator, the second biasing circuitry may include at least one second enable switch configured to enable the second bias current generator, and the at least one first enable switch and the at least one second enable switch may be configured to disable the second bias current generator when the first bias current generator is enabled, and to disable the first bias current generator and disconnect each respective first termination resistor when the second bias current generator is enabled.

A fourth implementation of such an integrated circuit device may further include first amplification circuitry in the first clock path configured to amplify clock signals in the first clock path, and second amplification circuitry in the second clock path configured to amplify clock signals in the second clock path.

According to an aspect of that fourth implementation, the first clock path may be a differential signal path, and the first amplification circuitry may include a respective amplifier in each respective leg of the first clock path.

In accordance with implementations of the subject matter of this disclosure, a clocking method for an integrated circuit device includes accepting an external clock signal on a first clock path and biasing the first clock path to controllably pass the external clock signal, generating an internal clock signal by accepting an external frequency reference signal on a second clock path, biasing the second clock path to controllably pass the external frequency reference signal, and generating the internal clock signal from the external frequency reference signal, and selecting, based on user input, a clock output to drive a functional circuit of the integrated circuit device, the clock output being selected from between (i) an output of the first clock path, and (ii) an output of the second clock path based on user input.

In a first implementation of such a method, accepting the external frequency reference signal on the second clock path may include accepting an external passive resonator signal on the second clock path.

A second implementation of such a method may further include sharing at least one input terminal of the integrated circuit device between the first clock path and the second clock path.

According to a first aspect of that second implementation, where each of the first clock path and the second clock path is a respective differential signal path, sharing at least one input terminal of the integrated circuit device between the first clock path and the second clock path may include sharing two input terminals of the integrated circuit device between the first clock path and the second clock path.

In a third implementation of such a method, biasing the first clock path may include generating a first bias current, and drawing the first bias current through at least one termination resistor.

According to a first aspect of that third implementation, biasing the second clock path may include generating a second bias current that mirrors the first bias current.

An instance of that first aspect of the third implementation may include disabling generation of the second bias current when generating the first bias current, and disabling generation of the first bias current when generating the second bias current.

According to a second aspect of the third implementation, when the first clock path is a differential signal path, drawing the first bias current through at least one termination resistor may include drawing current through a respective termination resistor of each respective leg of the differential signal path.

In an instance of that second aspect, biasing the second clock path may include generating a second bias current that mirrors the first bias current, and the method may further include disabling generation of the second bias current when generating the first bias current, and disabling generation of the first bias current, and disconnecting each respective first termination resistor, when generating the second bias current.

A fourth implementation of such a method may further include amplifying clock signals in the first clock path, and amplifying clock signals in the second clock path.

According to a first aspect of the fourth implementation, when the first clock path is a differential signal path, amplifying clock signals in the first clock path may include amplifying clock signals in each respective leg of the first clock path.

According to implementations of the subject matter of this disclosure, an integrated circuit device (IC) having functional circuitry driven by a clock signal includes onboard clock generation circuitry. The clock generation circuitry includes an input configured to accept a frequency reference signal, at least one variable loading capacitor coupled to the input for converting the crystal resonator signal into a calibrated clock signal, and calibration circuitry configured to calibrate the at least one variable loading capacitor based on a reference voltage.

In a first implementation of such an integrated circuit device, the input configured to accept a frequency reference signal may be configured to accept a crystal resonator signal.

In a second implementation of such an integrated circuit device, the frequency reference signal may be a differential signal, the at least one variable loading capacitor may include a respective variable loading capacitor coupled to each respective differential leg of the differential frequency reference signal, and the calibration circuitry is configured to calibrate both of the respective variable loading capacitors.

In a third implementation of such an integrated circuit device, the calibration circuitry may include a source of constant reference voltage, a source of constant current, a pair of complementary switches coupled to the constant current source and to a variable reference capacitor, the complementary switches being configured to be clocked according the frequency reference signal to act as a resistor to convert the constant current to a derived voltage that charges a selected variable capacitor, calibration logic circuitry configured to vary a capacitance setting of the selected variable capacitor, and a comparator configured to change states when the derived voltage passes through the reference voltage, the calibration logic circuitry setting the at least one variable loading capacitor to the capacitance of the selected variable capacitor when the comparator changes state.

According to a first aspect of the third implementation, the selected variable capacitor may be one of the at least one variable loading capacitor.

In an instance of the first aspect of the third implementation, the frequency reference signal may be a differential signal, the at least one variable loading capacitor may include a respective variable loading capacitor coupled to each respective differential leg of the differential frequency reference signal, and the calibration logic circuitry may set each respective variable loading capacitor to the capacitance of the selected variable capacitor when the comparator changes state.

According to a second aspect of the third implementation, the selected variable capacitor may be a replica of one of the at least one variable loading capacitor.

In an instance of that second aspect of the third implementation, the frequency reference signal may be a differential signal, the at least one variable loading capacitor may include a respective variable loading capacitor coupled to each respective differential leg of the differential frequency reference signal, and the calibration logic circuitry may set each respective variable loading capacitor to the capacitance of the replica capacitor when the comparator changes state.

According to a third aspect of the third implementation, the calibration logic circuitry may be on the integrated circuit device.

According to a fourth aspect of the third implementation, the calibration logic circuitry may be external to the integrated circuit device.

According to a fifth aspect of the third implementation, the calibration logic circuitry may implement a finite state machine.

According to a sixth aspect of the third implementation, the complementary switches may be configured to be clocked at a frequency of the frequency reference signal.

According to a seventh aspect of the third implementation, the complementary switches may be configured to be clocked at a frequency derived from the frequency reference signal.

A method according to implementations of the subject matter of this disclosure, for generating a clock signal onboard an integrated circuit device, includes accepting input of a frequency reference signal, calibrating at least one variable loading capacitor coupled to the frequency reference signal, and converting the frequency reference signal into a calibrated clock signal using the at least one variable loading capacitor.

In a first implementation of such a method, accepting input of a frequency reference signal may include accepting input of a crystal resonator signal.

In a second implementation of such a method, accepting input of a frequency reference signal may include accepting input of a differential frequency reference signal, converting the frequency reference signal into a calibrated clock signal using a loading capacitor coupled to the frequency reference signal may include using a respective variable loading capacitor coupled to each respective differential leg of the differential frequency reference signal, and calibrating the at least one variable loading capacitor may include calibrating both of the respective variable loading capacitors.

In a third implementation of such a method, calibrating the at least one variable loading capacitor may include coupling a pair of complementary switches to a constant current source and to a variable reference capacitor, clocking the complementary switches according the frequency reference signal to act as a resistor to convert the constant current to a derived voltage that charges a selected variable capacitor, varying a capacitance setting of the selected variable capacitor, comparing magnitude of the derived voltage to a reference voltage, and setting the at least one variable loading capacitor to the capacitance of the selected variable capacitor when the magnitude of the derived voltage passes through a reference voltage.

According to a first aspect of the third implementation, clocking the complementary switches according the frequency reference signal to act as the resistor to convert the constant current to the derived voltage that charges the selected variable capacitor may include clocking the complementary switches according the frequency reference signal to act as the resistor to convert the constant current to the derived voltage that charges the at least one variable loading capacitor.

In a first instance of that first aspect of the third implementation, when the frequency reference signal is a differential signal, setting the at least one variable loading capacitor to the capacitance of the selected variable capacitor when the magnitude of the derived voltage passes through a reference voltage may include setting capacitance of each one of a respective variable loading capacitor coupled to each respective differential leg of the differential crystal resonator signal to the capacitance of the selected variable capacitor when the magnitude of the derived voltage passes through the reference voltage.

According to a second aspect of the third implementation, coupling the pair of complementary switches to the constant current source and to the variable reference capacitor may include coupling the pair of complementary switches to the constant current source and to a replica of one of the at least one variable loading capacitor.

In a first instance of that second aspect of the third implementation, when the frequency reference signal is a differential signal, setting the at least one variable loading capacitor to the capacitance of the selected variable capacitor when the magnitude of the derived voltage passes through the reference voltage may include setting a respective variable loading capacitor coupled to each respective differential leg of the differential frequency reference signal to the capacitance of the replica capacitor when the magnitude of the derived voltage passes through the reference voltage.

According to a third aspect of the third implementation, clocking the complementary switches according the frequency reference signal may include clocking the complementary switches at a frequency of the frequency reference signal.

According to a fourth aspect of the third implementation, clocking the complementary switches according the frequency reference signal may include clocking the complementary switches at a frequency derived from the frequency reference signal.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
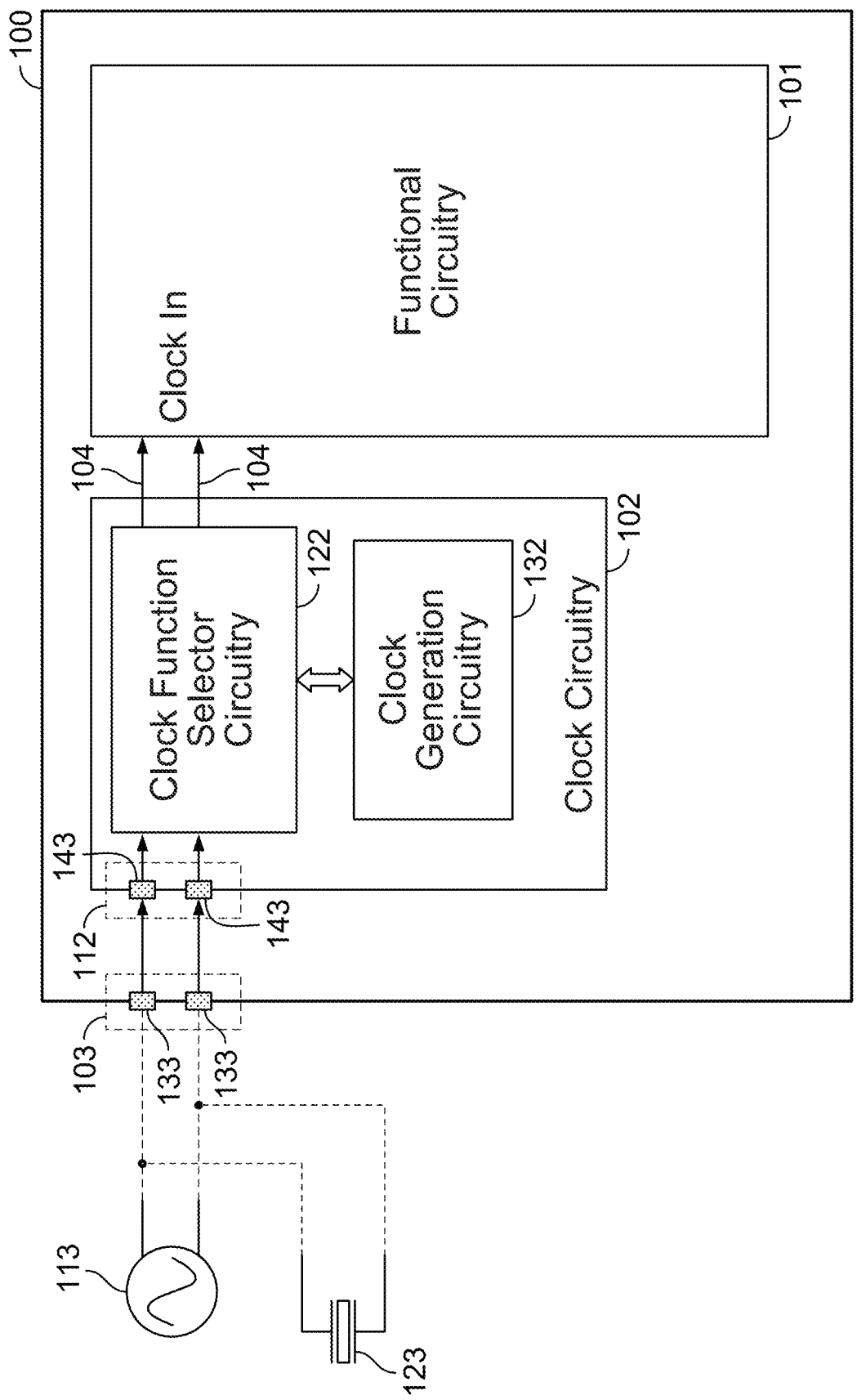
FIG. 1 is a simplified block diagram of an integrated circuit device in accordance with implementations of the subject matter of this disclosure.

Having an accurate reference clock is important for a high-performance, high-speed wireline transceiver such as a PAM-4 transceiver. For example, an accurate reference clock frequency is used to control the transmit data rate to comply with wireline communication standards. Good jitter performance of the reference clock is also important to maintain the link margin in a high-speed wireline system.

As noted above, using an external clock source, particularly one of reliable quality, with an integrated circuit wireline transceiver, may be expensive, and increase overall device size and power consumption when combined with the transceiver circuit itself. On the other hand, providing clock generation circuitry on the transceiver integrated circuit itself will increase the cost, size and power consumption of that integrated circuit. Implementations of the subject matter of this disclosure provides a balance between those two approaches.

Specifically, in accordance with implementations of the subject matter of this disclosure, an integrated circuit transceiver for a high-speed wireline data channel includes circuitry for accepting input of an externally generated clock signal, as well as onboard circuitry which generates a clock signal based on an external frequency reference signal source (such as a passive crystal resonator). Depending on the particular user application, the user may choose to use an externally generated clock signal—activating the circuitry for accepting input of an externally generated clock signal and deactivating the onboard clock generation circuitry—or the user may choose to activate the onboard clock generation circuitry and deactivate the circuitry for accepting input of an externally generated clock signal.

In some implementations, the circuitry for accepting input of an externally generated clock signal has its own input terminal or terminals (e.g., pins, pads or bumps, depending on the particular topology used in the device) for accepting the externally generated clock signal, while the onboard clock generation circuitry has its own input terminal or terminals for input of the external frequency reference signal source. In other implementations, the same input terminal or terminals are used whether the circuitry for accepting input of an externally generated clock signal or the onboard clock generation circuitry is used. If the same input terminal or terminals are used whether the circuitry for accepting input of an externally generated clock signal or the onboard clock generation circuitry is used, activating either the circuitry for accepting input of an externally generated clock signal or the onboard clock generation circuitry will disconnect or deactivate the input terminals for accepting input of an externally generated clock signal or an external frequency source from whichever of the two types of clock circuitry is not used. In either case, whether the circuitry for accepting input of an externally generated clock signal and the onboard clock generation circuitry share input terminals or have separate input terminals, either of those inputs may include one terminal or two terminals, depending on whether differential signaling or single-ended signaling is used for the external clock signal or the external frequency source signal.

Although any desired clock generation circuitry may be used as the onboard clock generation circuitry, according to implementations of another aspect of the subject matter of this disclosure, the capacitance value of a variable crystal-loading capacitor, for onboard generation of the clock signal from the external frequency source (such as a passive crystal resonator signal), may be calibrated from a constant current source, an available constant reference voltage on the device, and the desired clock frequency. In some implementations according this other aspect of the subject matter of this disclosure, the calibration circuitry may run directly off the resonator input. In other implementations according this other aspect of the subject matter of this disclosure, the calibration circuitry may include a replica capacitor to reduce loading on the resonator input. In some implementations, a finite state machine may translate the voltage, current and frequency signals into the desired capacitance value. The finite state machine may be implemented in firmware that is either onboard the integrated circuit device ("on-chip") or external to the integrated circuit device ("off-chip").

The subject matter of this disclosure may be better understood by reference to FIGS. 1-7.

FIG. 1 is a simplified block diagram of an integrated circuit device 100 in accordance with implementations of the subject matter of this disclosure.

Integrated circuit device 100 includes functional circuitry 101 (e.g., PAM-4 transceiver circuitry), and clock circuitry 102 which provides clock signal 104 for functional circuitry 101. As shown in FIG. 1, clock signal 104 is a differential signal, but in other implementations (not shown), clock signal 104 may be a single-ended signal.

Clock circuitry 102 includes external clock function input 112 which connects to at least one terminal 103 (i.e., a pin, pad, bump or ball contact, etc.) of integrated circuit device 100, clock function selector circuitry 122, and on-board clock generation circuitry 132.

As described above, and in more detail below, terminal 103 may accept an externally generated clock signal (generated by a clock source 113, such as a MEMS oscillator combined with a crystal resonator, or any other suitable clock source), or an external frequency reference signal (generated by an external frequency reference signal source such as passive crystal resonator 123). As in the case of clock signal 104, the externally generated clock signal and the external frequency reference signal may be single-ended signals, or may be differential signals. If the externally generated clock signal and the external frequency reference signal are single-ended signals, then terminal 103 and clock function input 112 are each a respective single pin, pad, bump, ball, etc. 133, 143. However, if the externally generated clock signal and the external frequency reference signal are differential signals, then terminal 103 and clock function input 112 may both be a pair of pins, pads, bumps, balls, etc. 133, 143.

In addition, while a single terminal 103 (which may be a pair of pins, pads, bumps, balls, etc. 133, 143 in a differential signal implementation) is shown, and clock function selector circuitry 122 can accept signals via clock function input 112 whether the input to terminal 103 is an externally generated clock signal or an external frequency reference signal, in other implementations (not shown) separate terminals 103 may be provided for the externally generated clock signal and the external frequency reference signal. However, using only one terminal 103 regardless of the type of input signal (i.e., whether the input signal is differential or single-ended) conserves available terminals of integrated circuit device 100 for other uses. If separate terminals 103 are provided for the externally generated clock signal and the external frequency reference signal, then both the externally generated clock signal source and the external frequency reference signal source may be coupled to their respective input terminals 103 at the same time, even though only one of the sources is in use. But if only one terminal 103 is provided, then even though both the externally generated clock signal source and the external frequency reference signal source are shown connected to terminal 103, the externally generated clock signal source and the external frequency reference signal source would not both be connected to terminal 103 simultaneously. Rather, only one of the two sources—either the externally generated clock signal source and the external frequency reference signal source—would be connected to terminal 103 at any one time.

Clock function selector circuitry 122 directs the input from terminal 103 to the appropriate destination. If an externally generated clock signal is being used, clock function selector circuitry 122 passes through the externally generated clock signal from terminal 103 to functional circuitry 101. If on-board clock generation is being used, clock function selector circuitry 122 directs the external frequency reference signal from terminal 103 to on-board clock generation circuitry 132, and then directs the generated clock output to functional circuitry 101 as clock signal 104.

Figure 2:
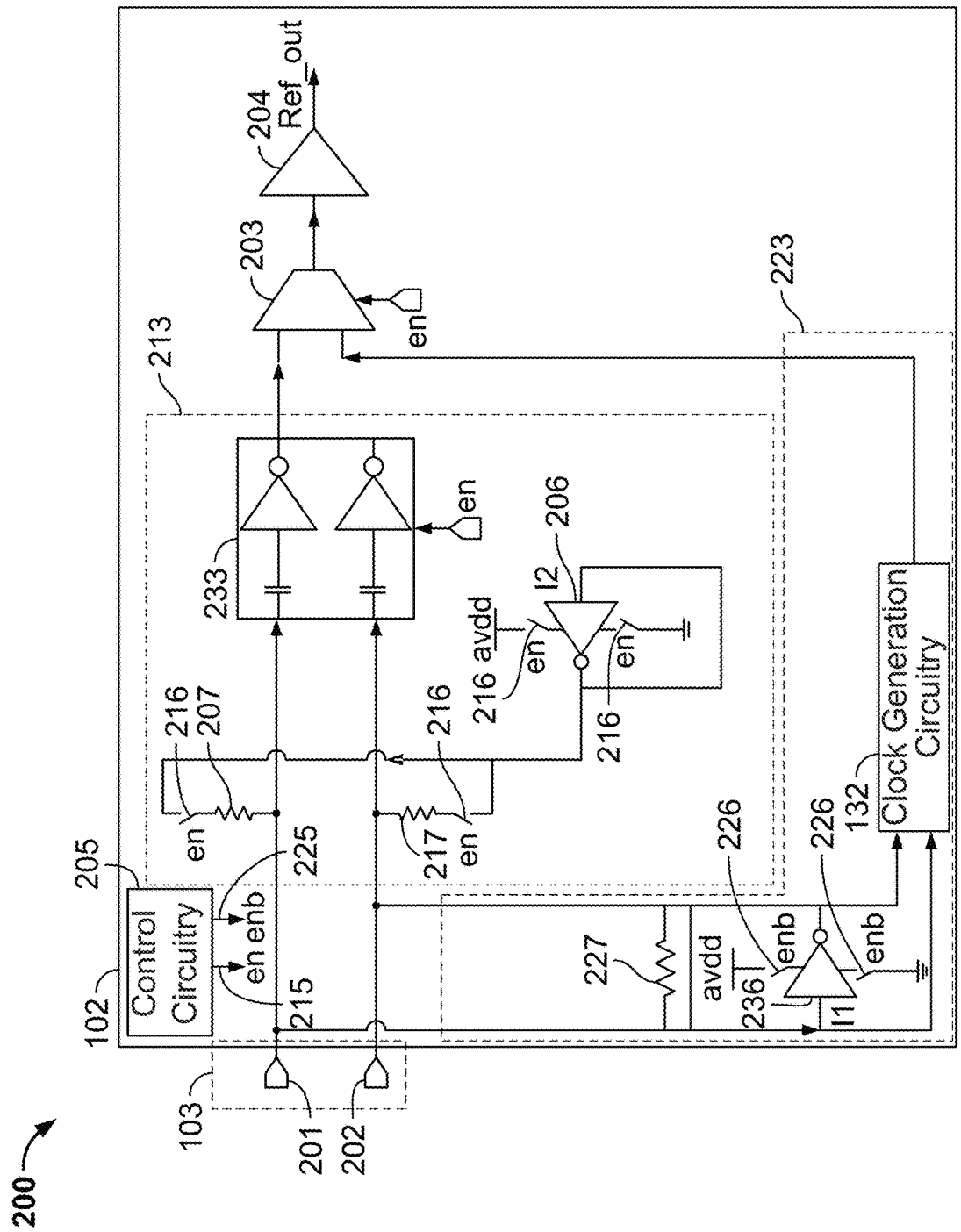
FIG. 2 shows details of clock function selector circuitry of the integrated circuit device of FIG. 1.

Details of clock function selector circuitry 122 are shown in FIG. 2. This implementation 200 is a differential implementation in which terminal 103 includes two pins/pads/bumps/balls etc. 201, 202. Multiplexer 203 selects between external clock path 213 and internal clock generation path 223, outputting either the passed-through external clock signal or an internally generated clock signal, respectively, which is then buffered at 204 for output to functional circuitry 101. Control circuitry 205 generates a complementary pair of enable signals en 215/enb 225 that control switches 216, 226, as well as multiplexer 203, to select between external clock path 213 and internal clock path 223.

Specifically, in this implementation, when en signal 215 is high and complementary enb signal 225 is low, external clock path 213 is enabled and internal clock path 223 is disabled, and when en signal 215 is low and complementary enb signal 225 is high, internal clock path 223 is enabled and external clock path 213 is disabled. In other implementations, when en signal 215 is low and complementary enb signal 225 is high, external clock path 213 is enabled and internal clock path 223 is disabled, and when en signal 215 is high and complementary enb signal 225 is low, internal clock path 223 is enabled and external clock path 213 is disabled.

External clock path 213 includes an amplifier/buffer 206 configured for unity gain feedback, generating and drawing current I2 through a respective termination impedance-matching resistors 207, 217 which may have identical resistance values (e.g., 50Ω) to match the impedance of the external clock source 113, which is coupled to terminal 103 when external clock path 213 is selected. This arrangement, drawing identical currents through identical resistors 207, 217, provides common-mode voltage biasing for the external clock signal generated by external clock source 113. Both legs of the differential clock signal on external clock path 213 are further buffered at 233, and may be passed as a single-ended signal (as shown) or a differential signal (not shown).

Internal clock path 223 also includes an amplifier/buffer 236 configured for unity gain feedback, generating and drawing current I1 through feedback resistor 227. Current I1 mirrors current I2 to provide a common-mode bias voltage for the external frequency reference signal generated by passive external resonator 123, similar to the common-mode bias voltage on external clock path 213. On-board clock generation circuitry 132 is coupled to the input and output of amplifier/buffer 236.

The specific nature of external clock source 113 or passive external resonator 123 form no part of the subject matter of this disclosure. Any suitable external clock source or external resonator may be used. In this implementation, if an external clock source 113 is being used, enable signal en is asserted high, making signal enb low. Therefore, impedance-matching resistors 207, 217 are connected, buffers 206, 233, are enabled, and multiplexer 203 selects external clock path 213, while buffer 236 is disabled. Similarly, if an external resonator is being used, enable signal en is deasserted, making signal enb high. Therefore, multiplexer 203 selects internal clock path 223 and buffer 236 is enabled, while impedance-matching resistors 207, 217 are disconnected, and buffers 206, 233 are disabled. As noted above, in other implementations, asserting en and deasserting enb, and vice-versa, may result in the opposite selections.

Although external clock path 213 and internal clock path 223 are shown as differential signal paths, they may be single-ended signal paths (connected only to terminal 201). In such case (not shown), impedance-matching resistor 217 is eliminated, buffer 233 buffers only a single path, and feedback resistor 227 is connected only to the path from terminal 201 to the output of buffer 236.

Figure 3:
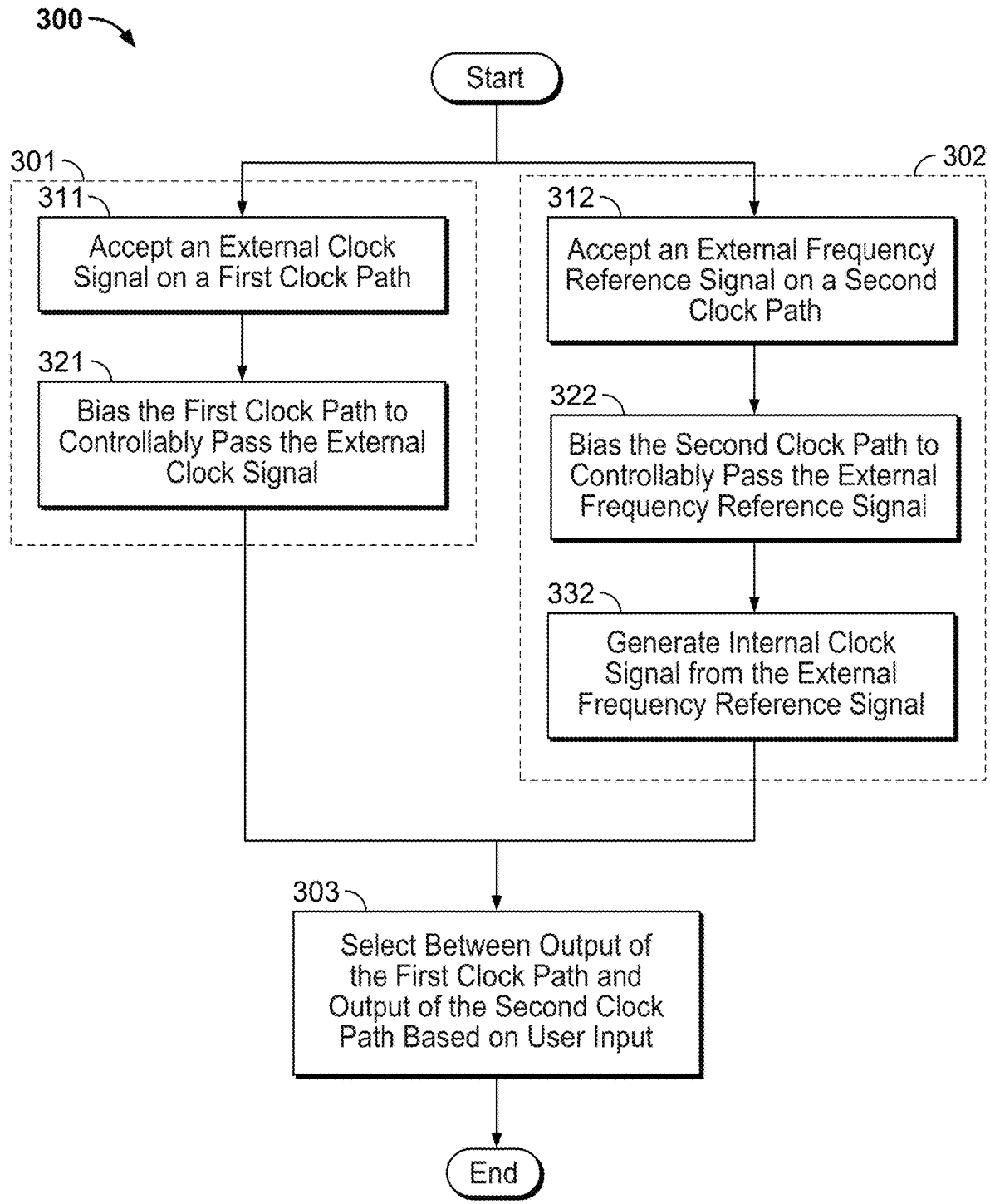
FIG. 3 is a flow diagram of a method according to implementations of the subject matter of this disclosure for selecting a clock signal.

A method 300 according to implementations of the subject matter of this disclosure for clocking an integrated circuit device is diagrammed in FIG. 3. In path 301, an external clock signal is accepted at 311 on a first clock path, and at 321 the first clock path is biased to controllably pass the external clock signal. In path 302, an external frequency reference signal is accepted at 312 on a second clock path, at 322 the second clock path is biased to controllably pass the external frequency reference signal, and at 332, an internal clock signal is generated from the external frequency reference signal. At 303, the output of the first clock path or the second clock path is selected based on user input.

Figure 4:
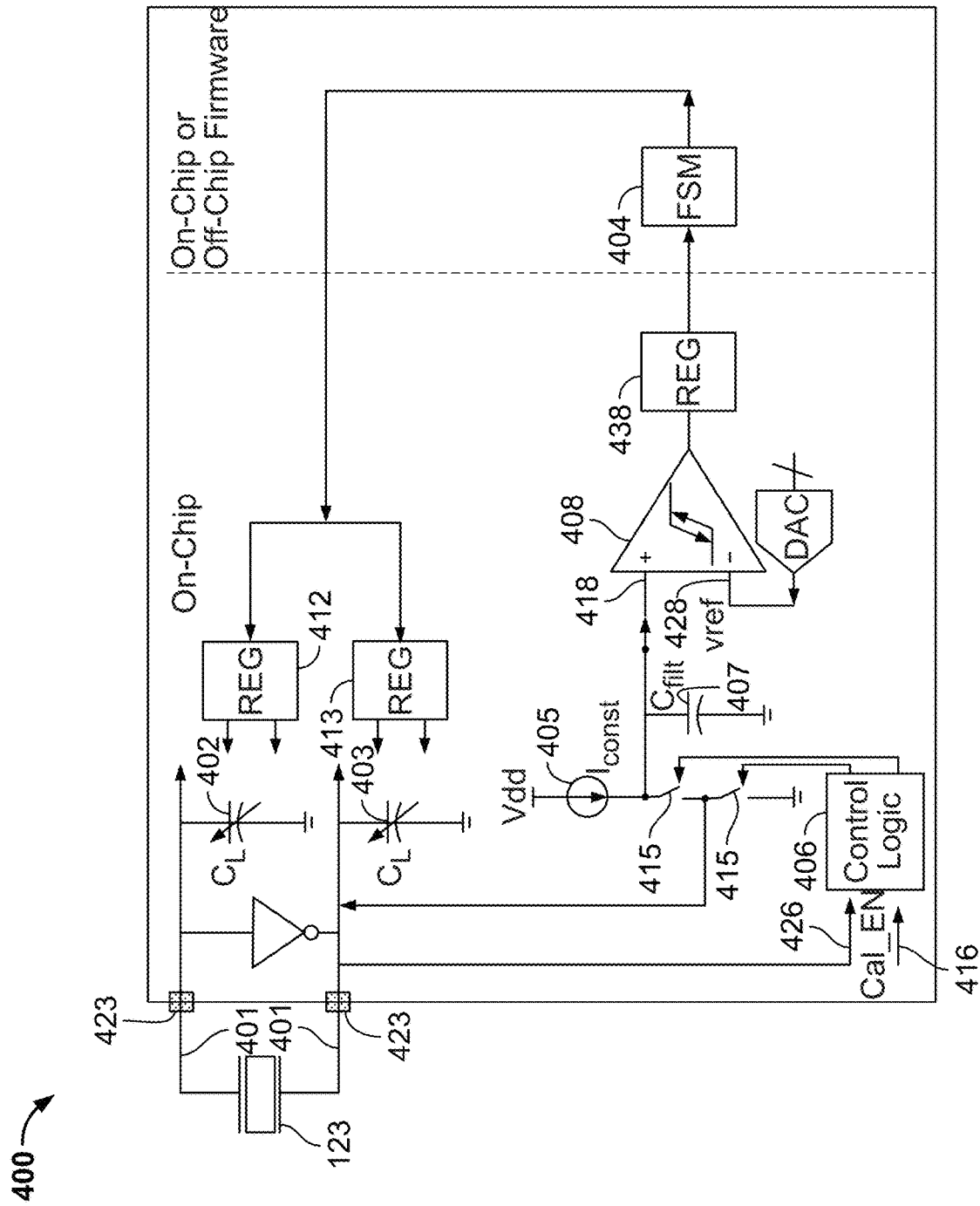
FIG. 4 shows details of on-board clock generation circuitry according to a first implementation of the subject matter of this disclosure.

FIG. 4 shows details of a first implementation 400 of on-board clock generation circuitry 132. Clock generation circuitry 132 generates a precision clock frequency from the external frequency reference signal generated by passive external resonator 123 (which, strictly speaking, is not part of on-board clock generation circuitry 132), input at terminals 423, by applying a precise loading capacitance to the external frequency reference signal.

Implementations of the subject matter of this disclosure generate the desired clock frequency by setting the capacitance of a programmable loading capacitor or, in the case of a differential signal, programmable loading capacitors, based on the following relationship:

$$C_L = \frac{I_{const}}{v_{ref} \times f_{clk}}$$

where $C_L$ is the target loading capacitance, $I_{const}$ is an available on-board constant current source, $v_{ref}$ is an available on-board voltage source, and $f_{clk}$ is the target clock frequency.

In on-board clock generation circuitry implementation 400 of FIG. 4, external frequency reference signal 401 generated by passive external resonator 123 is a differential signal, and therefore each leg of differential external frequency reference signal 401 is loaded by a respective programmably adjustable loading capacitor 402, 403. The values of capacitors 402, 403 are set, via programming registers 412, 413, by finite state machine 404, which may be implemented in firmware either on-chip or externally (off-chip), based on the foregoing relationship of the desired capacitance to an onboard constant current source, an onboard reference voltage, and the target frequency, as follows.

Constant current source 405 outputs constant current $I_{const}$, which flows to ground through switches 415. In a programming or calibration mode that is active when Cal EN signal 416 is asserted, control logic 406 causes switches 415 to alternatingly open and close at the frequency of external frequency reference signal 401 (which is input at 426 to control logic 406). The alternatingly opening and closing switches 415, along with capacitor 403, act as a resistance to constant current $I_{const}$, generating a voltage that charges capacitor 407, which is one input to comparator 408 at 418. The other input 428 to comparator 408 is the reference voltage $v_{ref}$, against which the generated voltage at 418 is compared, as a trimming mechanism, to convert the uncalibrated external frequency reference signal 401 into a calibrated clock signal.

Whenever the voltage at 418 passes through $v_{ref}$ in either direction, the state of the output of comparator 408, registered at 428, changes. That state change is detected by finite state machine 404, which uses the state changes to determine the correct values for loading capacitors 402, 403. For example, in one implementation, the capacitor value can be set to one extreme (maximum or minimum), and can be changed (decreased or increased) away from that extreme by one unit at a time until the comparator changes state.

Loading capacitors 402, 403 are set to that value. Finite state machine 404 may be implemented in firmware either on-chip or externally (off-chip).

Figure 5:
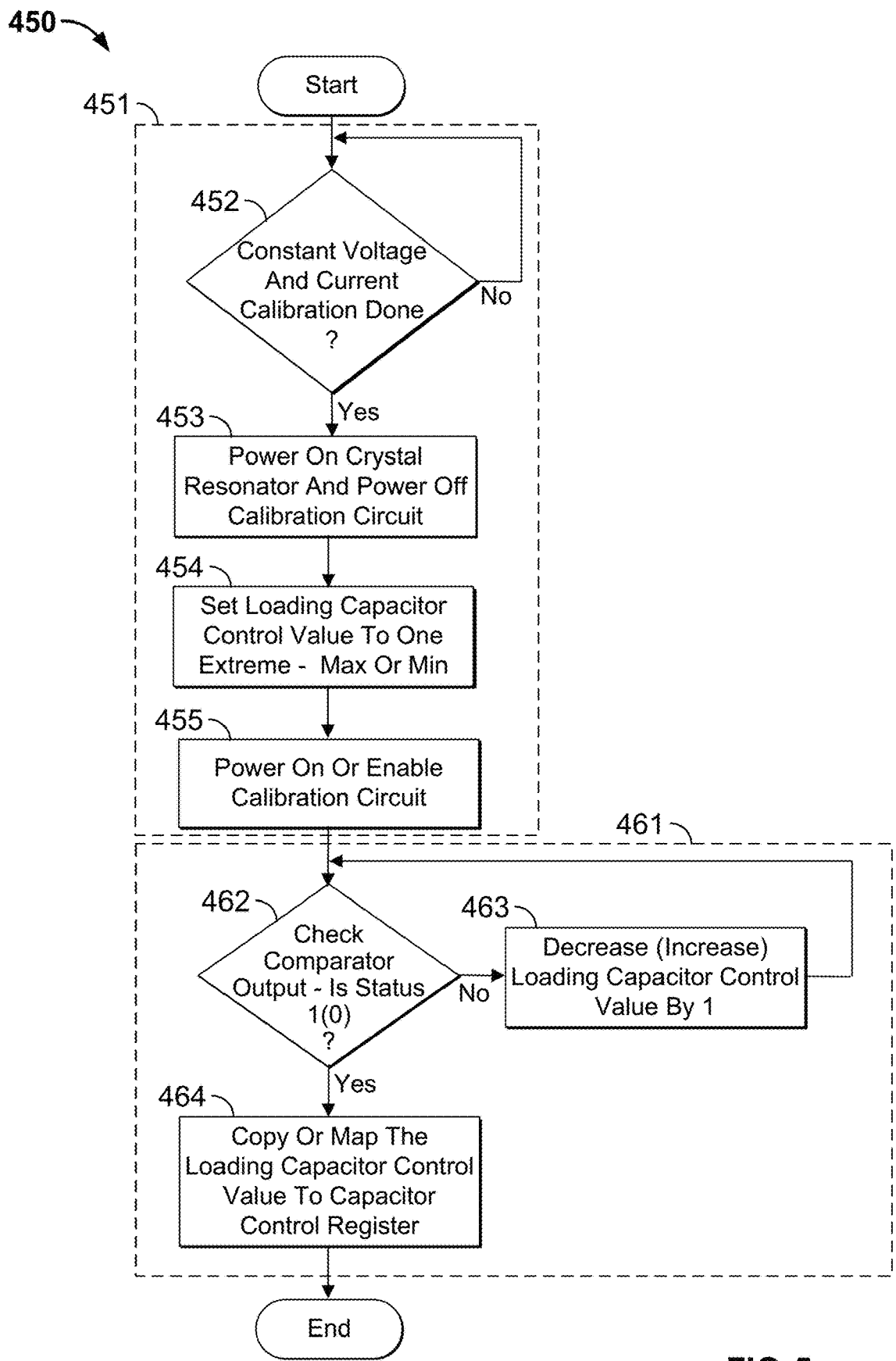
FIG. 5 is a flow diagram of a method performed in an implementation of a finite state machine included in FIG. 4.

One implementation of finite state machine 404 may implement the method 450 shown in FIG. 5, which includes an initialization stage 451 and an adaptation stage 461.

In initialization stage 451, a constant voltage source and a constant current source are calibrated at 452. When calibration 452 is complete, an external frequency reference source (e.g., a crystal resonator) is activated and the calibration mode is deactivated at 453. At 454, the loading capacitor control value is initialized to one extreme or the other—either the value resulting in maximum capacitance or the value resulting in minimum capacitance, and at 455 the calibration mode is reactivated.

In adaptation stage 461, the comparator output is checked to see if it has changed from '0' to '1' (in an implementation in which the loading capacitor control value is initialized to maximum) or '1' to '0' (in an implementation in which the loading capacitor control value is initialized to minimum). If the comparator has not changed state, then at 463 the loading capacitor control value is decreased (in an implementation in which the loading capacitor control value is initialized to maximum) by '1' or increased (in an implementation in which the loading capacitor control value is initialized to minimum) by '1', and the comparator state is again checked at 462. Once the comparator changes state, then at 464 the loading capacitor control value is written to registers 412, 413 and method 450 ends.

Figure 6:
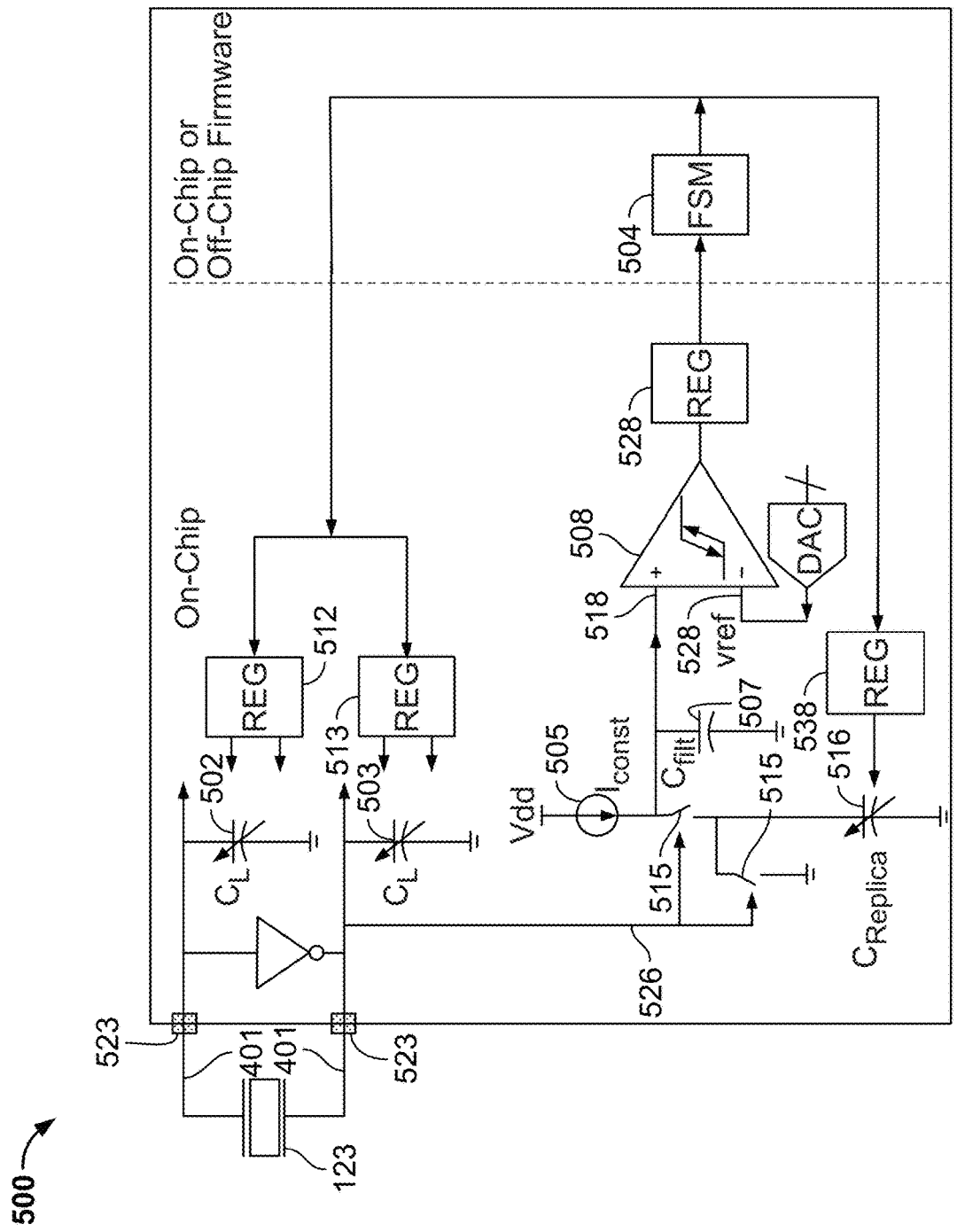
FIG. 6 shows details of on-board clock generation circuitry according to a second implementation of the subject matter of this disclosure.

FIG. 6 shows details of a second implementation 500 of on-board clock generation circuitry 132. In on-board clock generation circuitry implementation 500 of FIG. 6, external frequency reference signal 401 generated by passive external resonator 123 is a differential signal as in FIG. 4, and therefore each leg of differential external frequency reference signal 401 is loaded by a respective programmably adjustable loading capacitor 502, 503. The values of capacitors 502, 503 are set, via programming registers 512, 513, based on output of finite state machine 504, which may be implemented in firmware either on-chip or externally (off-chip), based on the foregoing relationship of the desired capacitance to an onboard constant current source, an onboard reference voltage, and the target frequency, as follows.

In a programming or calibration mode, constant current $I_{const}$, output by constant current source 505 flows through alternatingly opening and closing switches 515, and then to ground, loaded by capacitor 516, which is a replica of capacitor 503. Alternatingly opening and closing switches 515 open and close at the frequency of external frequency reference signal 401 (which is input via 526), and act as a resistance to constant current $I_{const}$, generating a voltage that charges capacitor 507, which is one input to comparator 508 at 518. The other input to comparator 508 at 528 is the reference voltage $v_{ref}$.

Replicating the loading capacitors 502, 503 with replica capacitor 516 reduces the loading on terminals 523, and also adds flexibility to the selection of $I_{const}$ and $v_{ref}$. The relevant relationship in this implementation is:

$$C_{replica} = \frac{I_{const}}{v_{ref} \times f_{clk}}$$

Whenever the voltage at 518 passes through $v_{ref}$, in either direction, the output of comparator 508, registered at 528, changes. That change is detected by finite state machine 504, which uses the change to determine the correct value for replica capacitor 516, via register 538, in a manner similar to that described above in connection with finite state machine 404 in FIGS. 4 and 5. Loading capacitors 502, 503 are set to that value. Finite state machine 504 may be implemented in firmware either on-chip or externally (off-chip).

Figure 7:
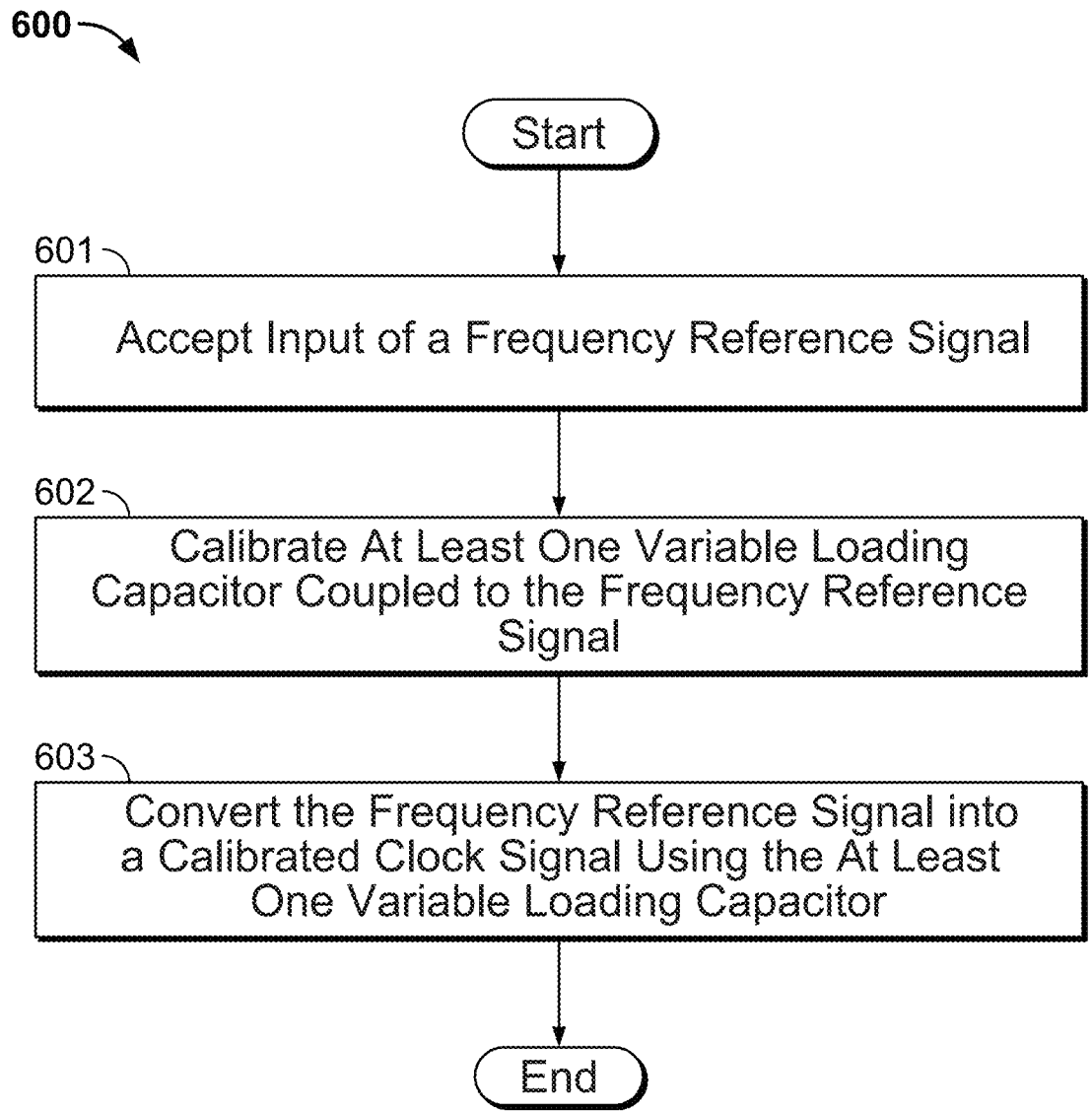
FIG. 7 is a flow diagram of a method according to implementations of the subject matter of this disclosure for generating a clock signal.

A method 600 according to implementations of the subject matter of this disclosure for on-board generation of a clock signal is diagrammed in FIG. 7. Method 600 starts at 601, where input of a frequency reference signal is accepted. At 602, at least one variable loading capacitor coupled to the frequency reference signal is calibrated. At 603, the frequency reference signal is converted into a calibrated clock signal using the at least one variable loading capacitor, and method 600 ends.

Thus it is seen that clock circuitry for integrated circuit devices, such as high-performance, high-speed wireline transceivers, supporting both internal and external clock signal generation, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An integrated circuit device (IC) having functional circuitry driven by a clock signal, the IC comprising:
    a first clock path for accepting an external clock signal, the first clock path comprising first biasing circuitry configured to controllably pass the external clock signal;
    a second clock path for accepting an external frequency reference signal, the second clock path comprising:
        internal clock generation circuitry configured to generate an internal clock signal from the external frequency reference signal, and
        second biasing circuitry configured to controllably pass the external frequency reference signal to the internal clock generation circuitry; and
    selector circuitry configured to select, based on user input, a clock output to drive the functional circuitry of the IC, the clock output being selected from between (i) an output of the first clock path, and (ii) an output of the second clock path.

2. The IC of claim 1 wherein the second clock path is configured to accept a passive resonator signal as the external frequency reference signal.

3. The IC of claim 1 wherein the first clock path and the second clock path share at least one input terminal of the integrated circuit device.

4. The IC of claim 3 wherein:
    each of the first clock path and the second clock path is a respective differential signal path; and
    the first clock path and the second clock path share two input terminals of the integrated circuit device.

5. The IC of claim 1 wherein the first biasing circuitry comprises:
    at least one termination resistor; and
    a first bias current generator configured to draw current through the at least one termination resistor.

6. The IC of claim 5 wherein the second biasing circuitry comprises a second bias current generator that mirrors the first bias current generator.

7. The IC of claim 6 wherein:
the first biasing circuitry comprises at least one first enable switch configured to enable the first bias current generator;
the second biasing circuitry comprises at least one second enable switch configured to enable the second bias current generator; and
the at least one first enable switch and the at least one second enable switch are configured to disable the second bias current generator when the first bias current generator is enabled, and to disable the first bias current generator when the second bias current generator is enabled.

8. The IC of claim 5 wherein:
the first clock path is a differential signal path;
the at least one termination resistor comprises a respective termination resistor for each respective leg of the differential signal path; and
the first bias current generator is configured to draw current through the respective termination resistor of each respective leg of the differential signal path in a common mode arrangement.

9. The IC of claim 8 wherein:
the second biasing circuitry comprises a second bias current generator that mirrors the first bias current generator;
the first biasing circuitry comprises at least one first enable switch configured to enable the first bias current generator and a respective additional first enable switch configured to switchably couple each respective first termination resistor to the first bias current generator;
the second biasing circuitry comprises at least one second enable switch configured to enable the second bias current generator; and
the at least one first enable switch and the at least one second enable switch are configured to disable the second bias current generator when the first bias current generator is enabled, and to disable the first bias current generator and disconnect each respective first termination resistor when the second bias current generator is enabled.

10. The IC of claim 1 further comprising:
first amplification circuitry in the first clock path configured to amplify clock signals in the first clock path; and
second amplification circuitry in the second clock path configured to amplify clock signals in the second clock path.

11. The IC of claim 10 wherein:
the first clock path is a differential signal path; and
the first amplification circuitry comprises a respective amplifier in each respective leg of the first clock path.

12. A clocking method for an integrated circuit device, the clocking method comprising:
accepting an external clock signal on a first clock path and biasing the first clock path to controllably pass the external clock signal;
generating an internal clock signal by:
accepting an external frequency reference signal on a second clock path,
biasing the second clock path to controllably pass the external frequency reference signal, and
generating the internal clock signal from the external frequency reference signal; and
selecting, based on user input, a clock output to drive a functional circuit of the IC, the clock output being selected from between (i) an output of the first clock path, and (ii) an output of the second clock path based on user input.

13. The method of claim 12 wherein accepting the external frequency reference signal on the second clock path comprises accepting an external passive resonator signal on the second clock path.

14. The method of claim 12 further comprising sharing at least one input terminal of the integrated circuit device between the first clock path and the second clock path.

15. The method of claim 14 wherein, where each of the first clock path and the second clock path is a respective differential signal path, sharing at least one input terminal of the integrated circuit device between the first clock path and the second clock path comprises sharing two input terminals of the integrated circuit device between the first clock path and the second clock path.

16. The method of claim 12 wherein biasing the first clock path comprises:
generating a first bias current; and
drawing the first bias current through at least one termination resistor.

17. The method of claim 16 wherein biasing the second clock path comprises generating a second bias current that mirrors the first bias current.

18. The method of claim 17 comprising disabling generation of the second bias current when generating the first bias current, and disabling generation of the first bias current when generating the second bias current.

19. The method of claim 16 wherein, when the first clock path is a differential signal path, drawing the first bias current through at least one termination resistor comprises drawing current through a respective termination resistor of each respective leg of the differential signal path.

20. The method of claim 19 wherein:
biasing the second clock path comprises generating a second bias current that mirrors the first bias current;
the method further comprising:
disabling generation of the second bias current when generating the first bias current; and
disabling generation of the first bias current, and disconnecting each respective first termination resistor, when generating the second bias current.

21. The method of claim 12 further comprising:
amplifying clock signals in the first clock path; and
amplifying clock signals in the second clock path.

22. The method of claim 21 wherein, when the first clock path is a differential signal path, amplifying clock signals in the first clock path comprises amplifying clock signals in each respective leg of the first clock path.

* * * * *